United States Patent
Seitz et al.

(10) Patent No.: US 9,535,244 B2
(45) Date of Patent: Jan. 3, 2017

(54) EMULATION OF REPRODUCTION OF MASKS CORRECTED BY LOCAL DENSITY VARIATIONS

(71) Applicant: Carl Zeiss SMT GmbH, Oberkochen (DE)

(72) Inventors: Holger Seitz, Jena (DE); Thomas Thaler, Jena (DE); Ulrich Matejka, Jena (DE); Thomas Rademacher, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/594,851

(22) Filed: Jan. 12, 2015

(65) Prior Publication Data

US 2015/0198798 A1    Jul. 16, 2015

(30) Foreign Application Priority Data

Jan. 13, 2014  (DE) .......................... 10 2014 000 454

(51) Int. Cl.
*G06K 9/00* (2006.01)
*G02B 21/36* (2006.01)
*G03F 1/84* (2012.01)
*G03F 1/70* (2012.01)

(52) U.S. Cl.
CPC .............. *G02B 21/365* (2013.01); *G03F 1/70* (2013.01); *G03F 1/84* (2013.01)

(58) Field of Classification Search
CPC ....... G02B 21/365; G02B 21/361; G03F 1/70; G03F 1/84; G03F 7/2028; G06T 7/001

USPC .................................................. 382/141, 144
See application file for complete search history.

(56) References Cited

U.S. PATENT DOCUMENTS

| 8,355,807 B2 * | 1/2013 | Fan ......................... G03F 1/144 |
| | | 700/108 |
| 8,458,622 B2 * | 6/2013 | Pang ........................ G06T 7/001 |
| | | 716/50 |
| 8,705,838 B2 * | 4/2014 | Boehm ...................... G03F 1/84 |
| | | 382/144 |

(Continued)

FOREIGN PATENT DOCUMENTS

| DE | 10 2008 015 631 | 9/2009 | ............ G01M 11/02 |
| DE | 10 2011 080 100 | 1/2013 | ............... G03F 1/74 |

*Primary Examiner* — Daniel Mariam
(74) *Attorney, Agent, or Firm* — Fish & Richardson P.C.

(57) ABSTRACT

A method is provided for emulating the imaging of a scanner mask pattern to expose wafers via a mask inspection microscope, in which the mask was corrected by introducing scattering centers. The method includes determining a correlation between the first values of at least one characteristic of aerial images of the mask pattern as produced by a mask inspection microscope and the second values of the at least one characteristic of aerial images of the mask pattern as produced by a scanner, recording a first aerial image of the mask pattern with the mask inspection microscope, determining the first values of the at least one characteristic from the first aerial image, and determining the second values of the at least one characteristic of the first aerial image, using the correlation. A mask inspection microscope is also provided for emulating the imaging of a mask pattern of a scanner to expose wafers, in which the mask was corrected by introducing scattering centers.

20 Claims, 6 Drawing Sheets

(56) References Cited

U.S. PATENT DOCUMENTS

| | | | |
|---|---|---|---|
| 8,730,474 B2* | 5/2014 | Scheruebl | G03F 1/84 356/237.4 |
| 8,913,120 B2* | 12/2014 | Poortinga | G03F 1/144 348/79 |
| 2007/0065729 A1 | 3/2007 | Zait et al. | |
| 2011/0016437 A1 | 1/2011 | Scheruebl et al. | |

* cited by examiner

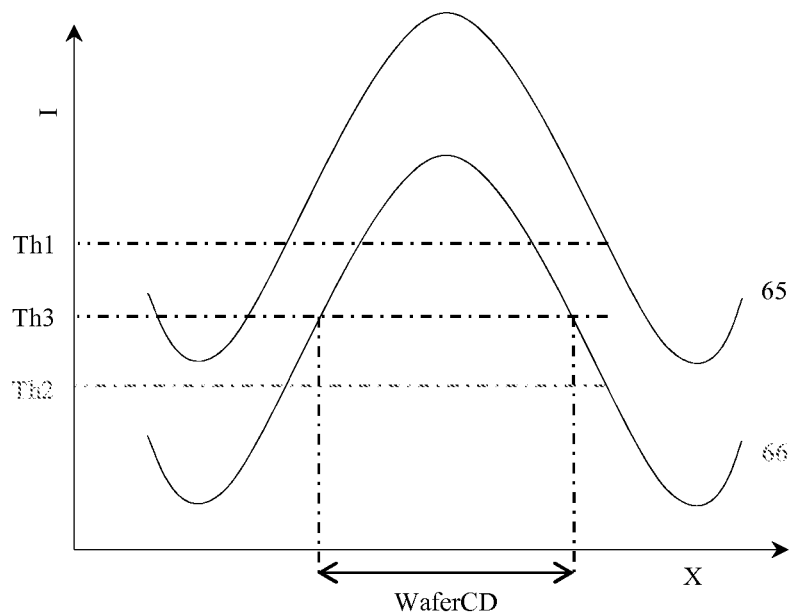

EMULATION OF REPRODUCTION OF MASKS CORRECTED BY LOCAL DENSITY VARIATIONS

CROSS-REFERENCE TO RELATED APPLICATION

Under 35 U.S.C. §119, this application claims priority to German Patent Application 10 2014 000 454.6, filed on Jan. 13, 2014. The disclosure content of the above application is hereby incorporated by reference in its entirety.

TECHNICAL FIELD

This patent application relates generally to a method for emulating the reproduction of a scanner for exposing wafers of a mask pattern by using a mask inspection microscope, in which the mask was corrected by introducing scattering centers, and a mask inspection microscope for emulating the reproduction of a scanner for exposing wafers of a mask pattern, in which the mask was corrected by introducing scattering centers.

BACKGROUND

In lithography for manufacturing semiconductor devices, the patterns (or structures) on a mask (also called a reticle) are projected by wafer exposure equipment onto a wafer that has a photosensitive layer, called the photoresist. When a microscope is used for mask inspection, the mask pattern is projected onto a photosensitive spatially resolved detector, such as, for example, a charged coupled device (CCD) sensor. In doing so, the pattern is enlarged by a factor of, e.g., 150 to 450, in order to more accurately detect any defects present in the patterns. When projecting the pattern onto the wafer, the pattern is imaged and reduced in size. For example, in modern scanners, the pattern is reduced by a factor of four.

Because defects that also occur during wafer exposure are primarily of interest during mask inspection, the aerial images produced in the resist and on the detector should be as identical as possible, except for the different magnification scale. In order to achieve equivalent image production, the wavelength of projection light, illumination settings, and the numerical aperture (NA) used on the object side, i.e., mask-side, are adjusted to be the same as, or as similar as possible to, the scanner used.

Mask inspection microscopes can operate in transmission or reflection. The mask pattern image is created after the projection light is transmitted through the mask (in the case of a transmission mask) or after the projection light is reflected from the mask surface (in the case of a reflective mask).

The projection light is optimized in scanners for wafer exposure in accordance with the patterns of the masks to be imaged in each case. Various lighting settings are used to define the lighting intensity distribution on a pupil plane of the light beam path of the mask inspection microscope. It is common to use various lighting settings having different degrees of coherence, as well as off-axis lighting settings such as annular illumination and dipole or quadrupole illumination. The depth of field or resolution can be increased by lighting settings that produce off-axis oblique lighting.

With microscopes that are used to examine masks, optics having a smaller field of view and a smaller illumination area are used compared to those of wafer exposure equipment.

In a method for optimizing masks, local density variations are introduced into the mask that function as scattering centers. The transmission and reflectivity of the mask are modified by the local density variations. This is used, for example, to optimize the critical dimension (CD) of a mask pattern, as well as the placement error (registration), i.e., the position of the mask patterns. The critical dimension refers to the dimension of a critical feature on the wafer, such as minimum line width of single lines, minimum line width of densely spaced lines, or the minimum size of contact holes. The projected light is attenuated through local density variations, hereinafter also called pixels. The intensity of an aerial image of the mask can be modified locally by the attenuation, e.g., by weakening or reduction of the transmission. This enables optimization of the critical dimension.

In the case of transmissive masks, the scattering centers are introduced into the mask by pulsed femtosecond lasers. This is known, for example, from U.S. published patent application 20070065729. The scattering centers can be introduced into the substrate of the mask with this method.

The introduction of scattering centers into extreme ultraviolet (EUV) masks by using electron beams is known from German patent application DE 10 2011 080 100 A1. In this method, scattering centers are introduced into the reflecting multilayer of the mask in order to reduce reflectivity.

SUMMARY

The change in pattern dimension (e.g., the critical dimension) resulting from the introduction of scattering centers has a different effect in the aerial images of a mask inspection microscope than it does in the aerial images of a scanner or than it does on the wafers exposed by a scanner. Even for masks that were not corrected by introducing scattering centers, the dimensions of a pattern determined from an aerial image of a mask inspection microscope are different from the dimensions of a pattern generated by a scanner on a wafer. The deviations in the pattern dimensions determined from the aerial images from a mask inspection microscope and in the pattern dimensions of the resulting wafer are disadvantageous. It is possible to predict the resulting structure from the aerial images produced by the mask inspection microscope with only limited accuracy.

In a general aspect, the invention is directed to a method and a mask inspection microscope that enables determination of the dimensions of patterns on a wafer more accurately from the aerial images produced by a mask inspection microscope is provided.

In another general aspect, a method for emulating the imaging of a scanner mask pattern to expose wafers by a mask inspection microscope is provided, in which the mask was corrected by introducing scattering centers. The method includes the following steps: determining a correlation between the first values of at least one characteristic of aerial images of the mask pattern produced by a mask inspection microscope and the second values of the at least one characteristic of aerial images of the mask pattern produced by a scanner; recording a first aerial image of the mask pattern with the mask inspection microscope; determining the first values of the at least one characteristic from the first aerial image; and determining, using the correlation, the second values of the at least one characteristic of the first aerial image.

The characteristics (or properties) can be characteristics (or properties) of the aerial images from which the pattern dimensions can be determined, but the characteristics can also be the dimensions themselves.

The correlation between the characteristics can be simple proportionality as well as a higher-order function. The correlation can also consist of pairs of values (e.g., in each pair of values, a characteristic value of aerial images of a mask inspection microscope maps to a characteristic value of aerial images of a scanner) in which intermediate values are determined by interpolating between the values.

After the correlation has been determined for a mask pattern, the characteristics of aerial images of other masks, as produced by a scanner, can be calculated from aerial images of the mask inspection microscope.

The correlation can be determined again in each case for different pattern types and different illumination settings.

One cause of deviations in the pattern dimensions determined from the aerial image produced by the mask inspection microscope and the dimensions of the pattern on the resulting wafer is the different illumination area sizes of the scanner and the mask inspection microscope. The illumination area of the scanner can be considerably larger than the illumination area of the mask inspection microscope.

The diameter d of the illumination area of the mask inspection microscopes can be in a range from 5 μm to 100 μm, preferably in a range from 8 μm to 50 μm, and especially preferably in a range from 10 μm to 30 μm.

The diameter of the illumination area of the scanner to be emulated can be greater by a factor of 100 or 500, preferably by a factor of 1,000, and especially preferably by a factor of 5,000, than the diameter of the illumination area of the mask inspection microscope.

It is useful to determine and use a correlation if the following applies to the diameter of the illumination area of the mask inspection microscope:

$$d < d_i = 4l_p \tan\left(\arcsin\left(\frac{NA_W}{4n_m}\right)\right)$$

Accordingly, the following applies to the diameter of the illumination field of the scanner: $d > d_i$. Estimating $d_i$ is further discussed below.

In the case of a quadratic or rectangular illumination area, the diameter d of the illumination area corresponds to the edge length or length of the shorter edge.

The characteristic can be determined from the pattern on a wafer that was produced by exposing the wafer with a scanner. When an aerial image produced by the scanner is not available (e.g., because the scanner is not used to expose a wafer to form a pattern on the wafer), the characteristic can be determined indirectly by aerial images produced by the mask inspection microscope.

The characteristic of the aerial image can be the attenuation that is caused by the scattering centers. The attenuation Att is a measure for the change in the transmission T. Thus, Att=1−T. The attenuation cannot be determined directly from the patterns on a wafer, and in general no aerial image of the pattern projected by the scanner is available. The attenuation can be determined by a hypothetical change in a threshold value that is obtained by evaluating the aerial images produced by the mask inspection microscope. This is explained in more detail below.

The characteristic of the pattern can also be the dimension of the pattern itself, for example the critical dimension. Then, a correlation is determined between the dimension of the pattern in the aerial images from the mask inspection microscope, and the dimension of the pattern in the aerial images from the scanner. Alternatively, the correlation can be determined from the deviations in dimensions from a predetermined dimension, such as the TargetCD.

As an example of the correlation of values of a characteristic (or property) of aerial images of a mask that were recorded using a mask inspection microscope and the aerial images that were recorded by a scanner, the quotient of the attenuation determined in each case is selected. This quotient is referred to as transmission coefficient or as transfer coefficient.

Even in the case of masks that have not been optimized by introducing scattering centers, the dimensions measured from an aerial image produced by a mask inspection microscope can deviate from the corresponding dimensions on a wafer. The target value of the critical dimension, the TargetCD, is predetermined. The deviation ΔMicroCD of the measurements MicroCD of the dimension of the mask inspection microscope are determined from the TargetCD, and the deviations ΔWaferCDpre of the dimensions WaferCDpre are determined on the wafer. The quotient determined from ΔWaferCDpre and ΔMicroCD is a correlation factor.

In another general aspect, the determined correlation factor is applied to a hypothetical change in the threshold of the aerial image from the scanner. This way, the accuracy of calibration is improved considerably.

It is understood that the features of the invention described above and also explained in detail below can be used not only according to the described combinations but also in further combinations or individually without departing from the scope of the invention.

BRIEF DESCRIPTION OF DRAWINGS

The invention is described and explained in more detail below using a few selected examples and the drawings.

FIGS. 4a-4c are graphs showing evaluations of the intensity gradient along a cross section of a mask pattern.

DETAILED DESCRIPTION

Figure 1:
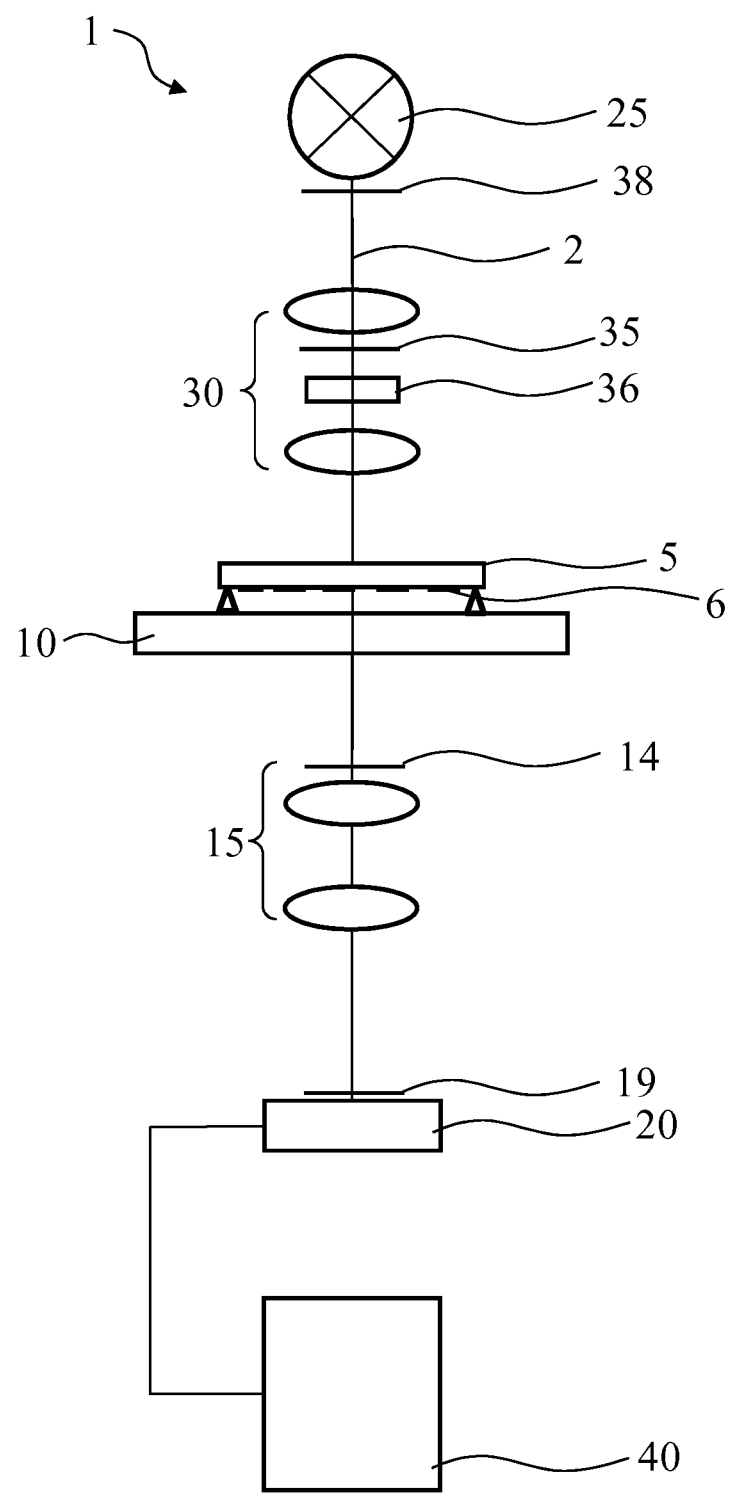
FIG. 1 is a schematic diagram of a mask inspection microscope.

The structure of a mask inspection microscope 1 is explained with reference to FIG. 1. The mask inspection microscope 1 includes a mask stage 10 to support a mask 5. The mask 5 is placed on the mask stage 10 with the pattern 6 to be imaged facing downward, i.e., in the direction of imaging optics 15. The aerial image of the mask is recorded by a detector 20, which can be, e.g., a charged coupled device (CCD) chip. The aerial image is read out by a processing unit 40, which can be, e.g., a computer. The aerial image is initially present as a data structure in the working memory of the computer and can be stored as a graphics file on the hard drive of the computer. The data structure or graphics file is a two-dimensional matrix that is made up of pixels. The intensities of the pixels are represented by numerical values, e.g., in the range from 0 to 65,535.

The field of view of the mask inspection microscope 1 is limited by a field stop 19. In this example, the resulting image field on the mask 5 has an edge length of 18 μm. A light source 25 illuminates the mask 5 through illumination optics 30 with projection light having a wavelength of, e.g., 193 nm. The illumination area is limited by an illumination field aperture 38. In this example, the resulting illumination field on the mask 5 has an edge length of 26 μm. The image scale is, e.g., 450:1. The lighting settings can be set by a pupil filter arranged on the pupil plane 35 and a polarizer 36. When recording the aerial images of the mask 5 using the detector 20, lighting settings and polarization settings are adjusted according to the patterns on the mask such that the lighting and polarization settings for recording the aerial images of the mask 5 are the same as, or as similar as possible to, the lighting and polarization settings that are used when exposing the wafer with a scanner.

By using the imaging optics 15 with an optical axis 2, an aerial image of the mask 5 is produced in the plane of the detector 20. The numerical aperture (NA) of the imaging optics 15 matches that of a scanner for wafer exposure on the object side, i.e., mask side. A scanner usually images the mask pattern with an imaging reduction ratio (e.g., ¼), such that the dimension of the pattern formed on the surface of a wafer is smaller than (e.g., ¼ of) the dimension of the pattern on the mask 5. For this reason, the mask-side $NA_M$ and the image-side, i.e., wafer-side, $NA_W$, follows Equation 1 below.

$$NA_M = NA_W/4 \quad \text{(Equation 1)}$$

For example, in modern scanners, $NA_W=1.35$ and thus $NA_M=0.34$. The numerical aperture value can be set by an NA aperture 14.

In some implementations, the mask inspection microscope works in reflection. Here, the mask is illuminated from the side of the pattern. The light reflected onto the mask pattern is imaged in a known manner by a mirror lens onto a detector. The projection light in this example has a wavelength of 13.5 nm.

The illumination field of a scanner that operates in the deep ultraviolet (DUV) range, in particular with projection light having a wavelength of 193 nm, and whose imaging behavior is being emulated, has an illumination field of 26 mm×33 mm, for example. If a mask has been optimized by introducing scattering centers, i.e., pixels, then a portion of the projection light is scattered by the pixels. Scattered light that has an angle relative to the optic axis that is greater than a critical angle ϕ no longer contributes to the imaging. The estimation of the critical angle ϕ is explained below with reference to a sketch in FIG. 2.

Figure 2:
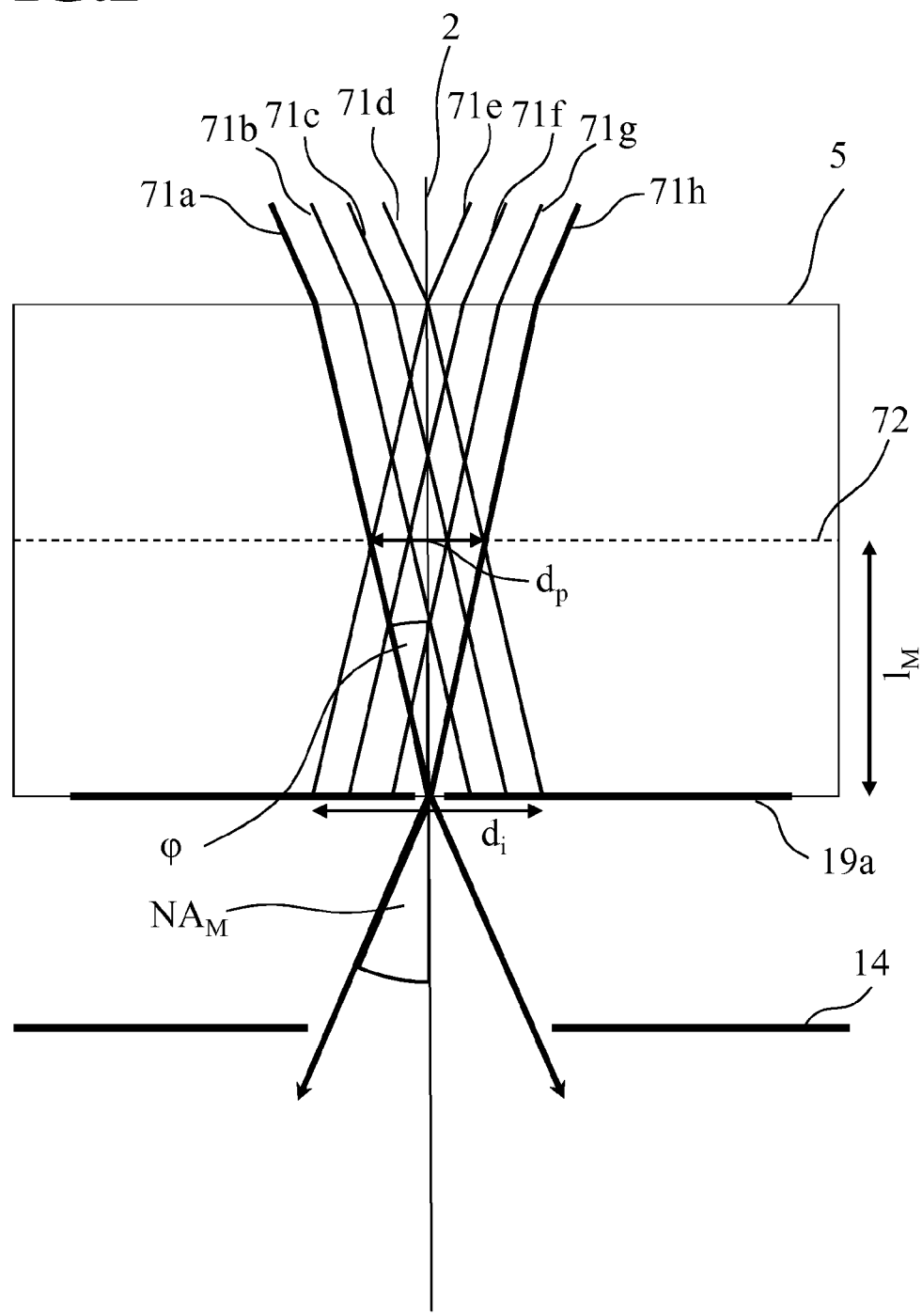
FIG. 2 is a cross-sectional diagram of the illumination of a corrected mask.

In a variant of the method, the pixels for optimizing the mask are introduced in the mask substrate in a layer parallel to the surface of the mask. This pixel layer is at a distance $l_M$ from the surface of the mask on which the mask pattern is formed. In some implementations, several pixel layers are introduced in which the distance between adjacent pixel layers is small in the thickness direction of the mask. For example, the distance of the pixel layer or the pixel layers from the mask surface can be $l_M=3175$ μm. In this example, the pixel layer lies at the center of the mask, and the value for $l_M$ corresponds to half the thickness of the mask. In the example in which several layers of pixels are formed, the distance between the layers can be in a range from, e.g., 20 μm to 80 μm. A cross-section of the mask 5 is shown in FIG. 2; the pixel layer is symbolized as a dashed line 72. In some implementations, the predetermined attenuation at each respective location is varied by the number of pixels per area. In some implementations, the predetermined attenuation at each respective location is varied by the shape of the pixels. In the following, only the variation of pixel density, i.e., the number of pixels per area, will be discussed.

The projection of the field stop 19a onto the surface of the mask 5 is shown in FIG. 2 in cross section by a thicker line with the reference numeral 19a. The NA aperture 14 is also shown in cross-section by thick lines.

The critical angle ϕ can now be determined from the given distance $l_M$ and the mask-side numerical aperture ($NA_M$) of the scanner used or the mask inspection microscope, taking into account the refraction index $n_M$ of the substrate of the mask for the projection light. This is illustrated by the example of a symmetric dipole illumination in FIG. 2. In this example, the poles' illumination angle corresponds to the mask-side numerical aperture $NA_M$. The beams 71a through 71d represent the first pole and the beams 71e through 71h represent the second pole of the projection light. The projection light is scattered at the pixel layer 72. If the beam is scattered at an angle that is greater than the critical angle ϕ, then the angle of the projection light after refraction when exiting the mask substrate is greater than the numerical aperture $NA_M$ of the lens of the mask inspection microscope or scanner and thus does not contribute to the imaging.

In some implementations, the mask substrate material can be, e.g., quartz glass having a refractive index of $n_M=1.56$. Thus, the critical angle ϕ from the mask-side numerical aperture $NA_M$ can be calculated by using the law of refraction in accordance with Equation 2 with the refraction index of air, $n_{Air}=1$.

$$NA_M = n_M \times \sin \phi \quad \text{(Equation 2)}$$

From the critical angle ϕ, the critical diameter $d_p$ of the scattering area of the pixel area can be calculated, which produces scattered projection light that contributes to the imaging. If a scattering area is illuminated by at least a diameter $d_p$, then the behavior during further enlargement of the area is approximately constant. The diameter $d_p$ is calculated from the critical angle ϕ by Equation 3.

$$\frac{d_p}{2l_M} = \tan \varphi \quad \text{(Equation 3)}$$

In the case of the mask inspection microscope, however, the illumination field is imaged onto the mask surface on which the pattern 6 is located. The diameter of this illumination area $d_i$ needs to be calculated. If the projection beaming is scattered at the critical angle ϕ relative to the optical axis, this happens in all directions. The diameter of this illumination field $d_i$ is greater than the illumination field on the pixel layer by a factor of 2. This results in Equation 4.

$$d_i = 2d_p \quad \text{(Equation 4)}$$

Thus, the critical diameter $d_i$ of the illumination area on the mask surface can be calculated using Equation 5.

$$d_i = 4l_M \tan\left(\arcsin\left(\frac{NA_W}{4n_M}\right)\right) \quad \text{(Equation 5)}$$

As an example of the correlation of values of a characteristic (or property) of aerial images of a mask that were recorded using a mask inspection microscope and the aerial images that were recorded by a scanner, the quotient of the attenuation determined in each case is selected. This quotient is referred to as transmission coefficient or as transfer coefficient.

To determine the transmission coefficients, a calibration mask is first created. This is a mask having a pattern with known dimensions, such as a pattern of, e.g., lines and spaces. The dimensions of this pattern on the mask can be measured using, e.g., a scanning electron microscope. From this mask, an aerial image is recorded with the mask inspection microscope. The transmission of the mask is changed by a pixel layer with a predetermined pixel density. Then, an aerial image is recorded from this modified mask with the mask inspection microscope. With the same modified mask, a wafer is exposed in a scanner with the mask, and the dimensions, such as the critical dimensions, of the pattern is measured.

In order to increase the accuracy of determining the transmission coefficients, areas of the mask with different attenuation, i.e., with different pixel density, are prepared. For each area, an aerial image is recorded using the mask inspection microscope and a wafer is exposed in order to determine the respective dimensions of the areas.

Figure 3A:
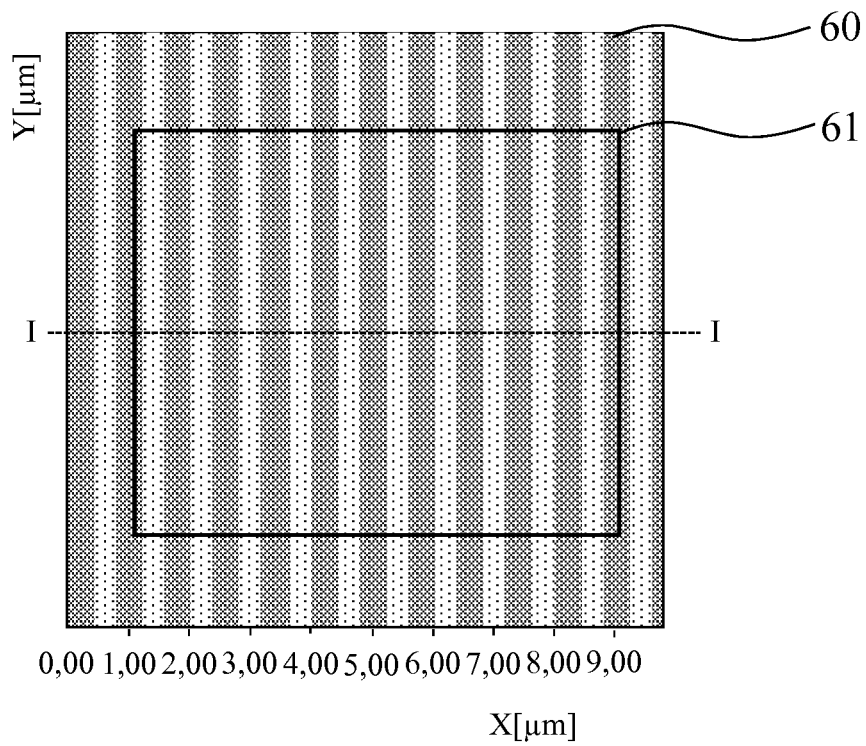
FIG. 3a is a diagram of a mask pattern.

The evaluation is performed on a pattern having a predetermined dimension as a critical dimension, hereinafter referred to as TargetCD. As an example, emulating the determination of the critical dimension of a pattern 60 from lines and spaces is shown schematically in FIG. 3a and described below.

An aerial image of the pattern 60 of a mask is recorded with a mask inspection microscope whose field of view is represented by the square 61. The determination of line width is performed perpendicular to the lengthwise direction of lines and spaces, in the example shown in FIG. 3a along the line I-I of the area 61. The X-axis of the diagram shows the variation of intensity in the X direction; the Y-axis shows the intensity I. The intensity variation of the aerial image along the line I-I shows an intensity minimum for each line and an intensity maximum for each space between the lines and is shown schematically in FIG. 3b.

Figure 3B:
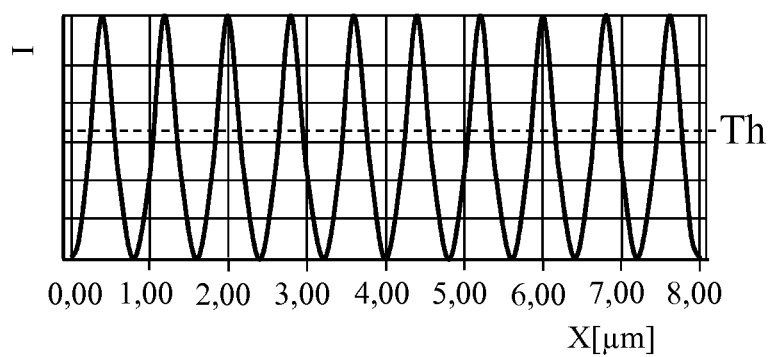
FIG. 3b is a graph showing the intensity profile of a mask pattern in cross-section.

The line width is determined at a set threshold value ("Th") of intensity I. The determination of the threshold value is based on a simple form of a resist simulator. In the case of a positive resist, all areas of the resist subject to light having intensity values equal to or over the threshold value are soluble in the developer, and that the remaining areas of the resist subject to light having intensity values below the threshold value remain insoluble. In the case of a negative resist, this behavior is reversed. FIG. 3b shows the selected threshold Th as a dashed line.

The evaluation is explained below using the intensity profile of an individual space between two lines. The respective intensity distributions are shown in FIGS. 4a to 4c.

An aerial image of a defect-free mask, e.g., a calibration mask that has not been optimized by introducing scattering centers, is recorded. The corresponding intensity variation is shown as a curve 65 in FIG. 4a. An intensity threshold value Th1 is determined at which the line width or the width of the space corresponds to a predetermined value for the pattern, such as the TargetCD. The intensity threshold value is shown by a dashed line in the X direction. The distance of the two intersection points of this line with the intensity profile to the left and right of the intensity maximum is the predetermined TargetCD.

An aerial image of the same section of the mask is also recorded with the mask inspection microscope, in which scattering centers have been introduced in the area of the recorded aerial image.

Figure 4A:
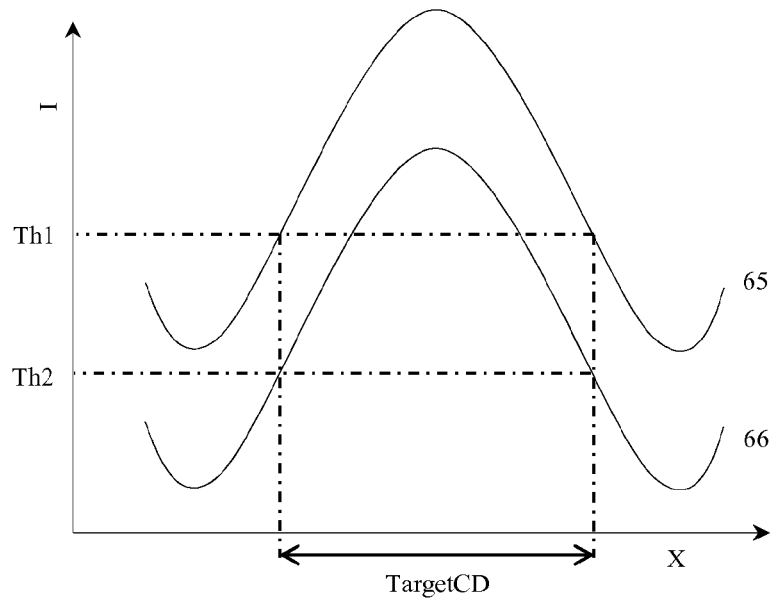
Figure 4B:
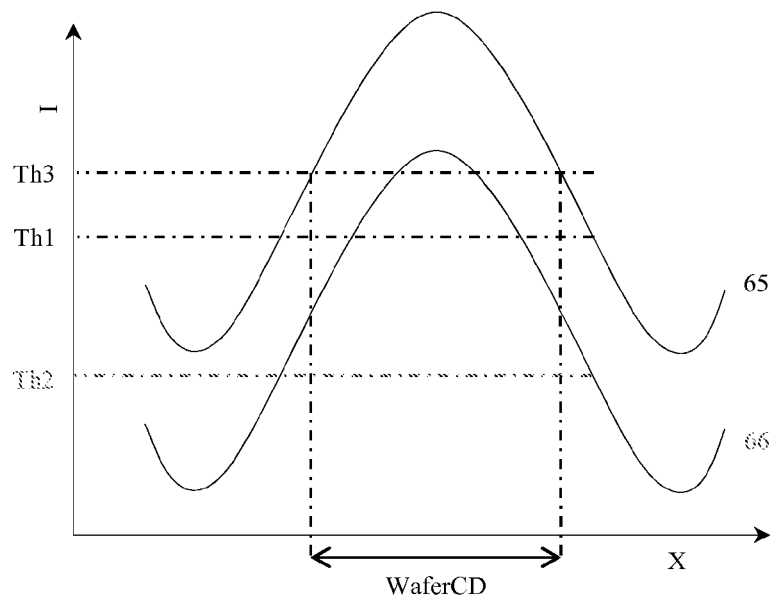

The corresponding intensity profile is shown as curve 66 in FIG. 4a. Similar to the manner in which Th1 is determined as described above, an intensity threshold value Th2 is also determined at which the line width or width of the space corresponds to the same predetermined target value for the pattern, the TargetCD.

The difference between the two threshold values is the attenuation, $Att_{MICRO}$, which is caused by the scattering centers, as they are measured by the mask inspection microscope. See Equation 6.

$$\Delta Th_{MICRO} = Th_1 - Th_2 = Att_{MICRO} \quad \text{(Equation 6)}$$

In the next step, the attenuation, $Att_{Wafer}$, of the same region as seen from a scanner is determined. For this purpose, a wafer is exposed in a scanner with the mask that has been optimized by introducing scattering centers, and the critical dimension on the resulting wafer is measured, which is identified as WaferCDpost.

Referring to FIG. 4b, the intensity threshold value Th3 of the aerial image of the mask that has not been optimized by introducing scattering centers is determined, at which threshold value the line width or width of the space corresponds to the measured critical dimension WaferCDpost.

The difference of the threshold value Th3 and the threshold value Th1 produces the attenuation, $Att_{Wafer}$, caused by the scattering centers as measured by the scanner. See Equation 7.

$$\Delta Th_{Wafer} = Th_3 - Th_1 = Att_{Wafer} \quad \text{(Equation 7)}$$

From the values for $Att_{MICRO}$ and $Att_{Wafer}$, the correlation is now calculated as the quotient of these values, represented by TC as indicated in Equation 8. This value is also referred to as a transfer coefficient.

$$TC = \frac{\Delta Th_{MICRO}}{\Delta Th_{Wafer}} \quad \text{(Equation 8)}$$

As mentioned above, the measurements can be performed at several areas of a mask with different attenuation. If $\Delta Th_{MICRO}$ is plotted via $\Delta Th_{Wafer}$, the resulting graph produces a straight line. The value for the transmission coefficient TC is then determined by linear regression.

If the transfer coefficient is known, it is possible to calculate, from aerial images of optimized masks that were recorded using the mask inspection microscope, the critical dimension of the pattern on a wafer exposed by a scanner using the optimized masks.

$\Delta Th_{MICRO}$ is determined from the aerial image of the mask recorded using the mask inspection microscope. The value for $\Delta Th_{Wafer}$ can be calculated from Equation 9.

$$\Delta Th_{Wafer} = \frac{\Delta Th_{MICRO}}{TC} \quad \text{(Equation 9)}$$

Then, the threshold value Th3 can be calculated using Equation 10. This is applied to the non-optimized aerial images measured using the mask inspection microscope. The evaluation produces the WaferCD of the optimized mask, as it would be produced by a scanner on a wafer.

$$Th_3 = Th_1 + \Delta Th_{Wafer} \quad \text{(Equation 10)}$$

Referring to FIG. 4c, in a variant of the method, the threshold value of the aerial image of the optimized mask is determined for calculating the WaferCDpost in accordance with Equation 11.

$$\Delta Th_{Wafer2} = Th_1 - Th_3 = Att_{Wafer} \quad \text{(Equation 11)}$$

The transfer coefficient $TC_2$ is then calculated by Equation 12.

$$TC_2 = \frac{\Delta Th_{MICRO}}{\Delta Th_{Wafer2}} \quad \text{(Equation 12)}$$

Figures 5A, 5B:
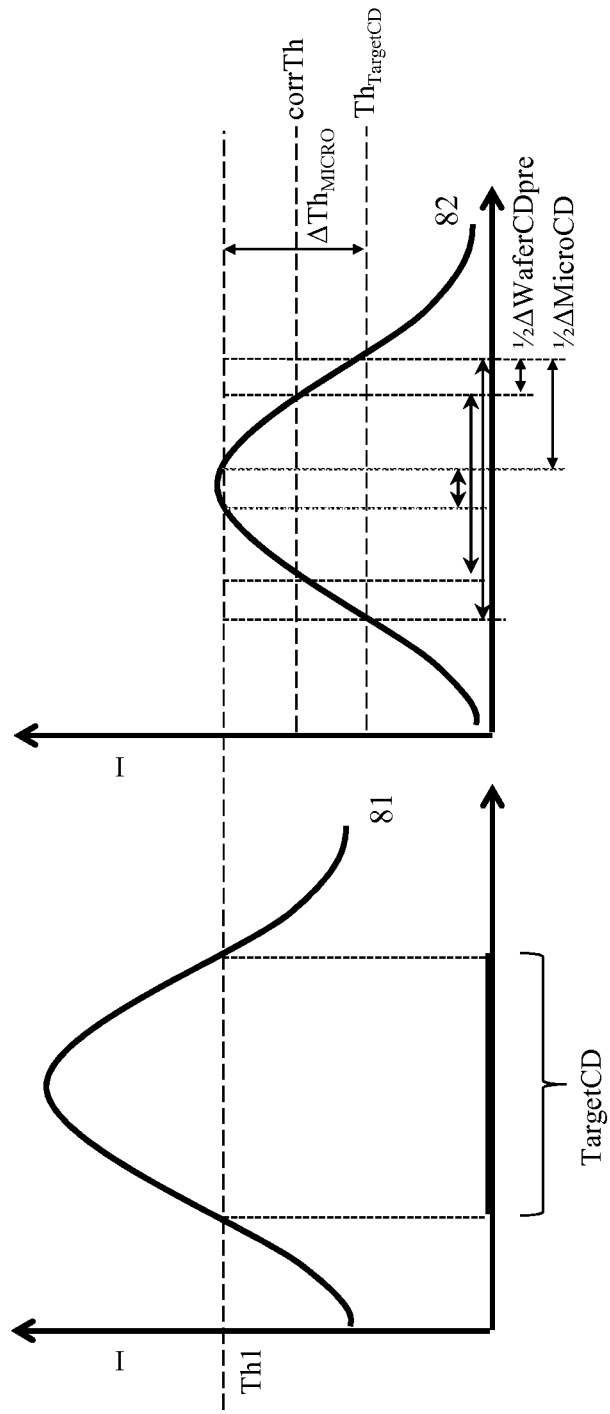
FIGS. 5a and 5b are graphs showing evaluations of the intensity gradient along a cross section of a mask pattern.

In some implementations, a method is provided for calibrating the measurement of dimensions of mask patterns of a mask using the mask inspection microscope based on the dimensions of the same pattern transferred onto a wafer by exposing the wafer using a scanner. Initially, the critical dimension MicroCD is measured using an aerial image produced by the mask inspection microscope at a predetermined threshold, $Th_A$. Using the same mask to expose a wafer by a scanner, the critical dimension of the pattern on the exposed wafer is measured, and this is referred to as WaferCDpre. The intensity profile for the calibration mask is shown as curve 81 in FIG. 5a. The intensity profile of an example of a mask to be measured with a different critical dimension is shown as curve 82 in FIG. 5b.

Deviations of the critical dimension determined from the aerial image, MicroCD, and of the critical dimension determined from the pattern on the wafer, WaferCDpre, are measured, and the differences, ΔMicroCD and ΔWaferCDpre, of the TargetCD are calculated in accordance with Equations 13 and 14.

TargetCD−MicroCD=ΔMicroCD (Equation 13)

TargetCD−WaferCDpre=ΔWaferCDpre (Equation 14)

These values are approximately proportional to each other. Their quotient is the pre-correlation factor PCF in accordance with Equation 15.

$$PCF = \frac{\Delta WaferCDpre}{\Delta MicroCD} \quad \text{(Equation 15)}$$

When this factor is known for a mask, the value WaferCDpre can be determined. At the aerial image to be measured a threshold $Th_{TargetCD}$ is determined, at which the dimension corresponds to the target value TargetCD, or a differently predetermined Threshold exists, which is taken as $Th_{TargetCD}$ for the following steps. The corrected threshold value corrTh of a given threshold value $Th_A$ can be calculated using the pre-correlation factor PCF according to Equation 16, shown below. For small values, a change in the threshold value is approximately proportional to the change in dimension.

corrTh=$Th_{TargetCD}$+($Th_A$−$Th_{TargetCD}$)×PCF (Equation 16)

The critical dimension determined using the threshold value corrTh is the WaferCDpre.

To increase the accuracy of determining the transfer coefficients, $Att_{Wafer}$ can be determined with increased accuracy. To determine $Att_{Wafer}$ with increased accuracy, Th1 can be replaced by corrTh, provided that the factor PCF is known.

To increase the accuracy of determining the WaferCD of the optimized mask, both methods can be used one after the other. The Th1 used is corrected following Equation 16. This means that the Th1 is used for $Th_A$ in Equation 16. Then, Equation 10 is used, in which Th1 is replaced by corrTh.

In a variant of this method, the dimensions of a mask pattern, e.g., a critical dimension, is used for the correlation of values of a characteristic of aerial images of a mask that were recorded using a mask inspection microscope and values of a characteristic of aerial images that were recorded based on the pattern on a wafer exposed by a scanner.

A calibration mask is again used, which exhibits a pattern of lines and spaces, for example. Areas with different attenuation are prepared on this mask, i.e., provided with different pixel density. For each area, an aerial image is recorded using the mask inspection microscope, and a wafer is exposed by a scanner in order to determine the respective critical dimensions. The critical dimension that is determined by the mask inspection microscope is identified as MicroCDpost. The critical dimension measured from the exposed wafer is identified as WaferCDpost.

As a correlation, WaferCDpost is now plotted dependent on MicroCDpost. In an initial variant, a linear equation is determined approximately from this graph as a correlation. In a variant of the method, a higher-order function is determined. In a further variant of the method, the values between the measured correlations are determined by interpolating the values.

For example, the features described above related to processing of data (for example, calculation of Equations 1 to 16) can be implemented by the processing unit 40, which can include one or more of digital electronic circuitry, computer hardware, firmware, and software. For example, some of the features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display) or OLED (organic light emitting diode) monitor for displaying information to the user and a keyboard and a pointing device such as a mouse or a trackball, or a touch or voice interface by which the user can provide input to the computer.

A number of implementations have been described. Nevertheless, it will be understood that various modifications may be made. Accordingly, other implementations are within the scope of the following claims.

What is claimed is:

1. A method for emulating the imaging of a scanner mask pattern to expose wafers via a mask inspection microscope, in which the mask includes scattering centers configured to scatter a portion of projection light that illuminates the mask, the method comprising:
    determining a correlation between first values of at least one characteristic of aerial images of a mask pattern produced by a mask inspection microscope and second values of the at least one characteristic of aerial images of the mask pattern produced by a scanner;
    recording a first aerial image of a mask pattern using the mask inspection microscope;
    determining the first values of the at least one characteristic from the first aerial image; and
    determining the second values of the at least one characteristic of the first aerial image, using the correlation.

2. The method of claim 1 in which the illumination field of the scanner is greater than the illumination field of the mask inspection microscope.

3. The method of claim 1 in which the illumination field of the scanner exhibits a diameter d for which the following applies:

$$d > d_i = 4l_p \tan\left(\arcsin\left(\frac{NA_W}{4n_m}\right)\right)$$

where $NA_W$ is the wafer-side numerical aperture of the scanner being emulated,
$n_M$ is the refraction index of a substrate of the mask, and
$l_p$ is a distance from the scattering centers to a pattern-bearing surface of the mask.

4. The method of claim 1 in which the characteristic of aerial images of the mask pattern as produced by the scanner is determined from a dimension of a mask pattern that was produced by the scanner on a wafer.

5. The method of claim 1 in which the at least one characteristic comprises an attenuation of transmission or reflectivity of the mask caused by the scattering centers.

6. The method of claim 5 in which an attenuation of aerial images of the mask as produced by the scanner is determined by the dimension of a mask pattern that was produced by the scanner on a wafer and from the aerial images of the mask as produced by a mask inspection microscope.

7. The method of claim 5 in which a threshold value $Th_1$ is determined to determine an attenuation from an aerial image of the mask inspection microscope, wherein the dimensions correspond to the dimensions on the wafer.

8. The method of claim 5 in which the aerial image was recorded by a mask that was not corrected and wherein a corrected threshold value corrTh is calculated from the threshold value $Th_1$,
    wherein corrTh is determined according to:
    predetermining a critical dimension target value TargetCD for the dimension of a calibration mask,
    recording an aerial image of the calibration mask,
    determining critical dimensions MicroCD measured using the mask inspection microscope from the aerial image using the threshold value $Th_1$,
    measuring a critical dimension WaferCDpre from a wafer exposed by a scanner,
    calculating a pre-correlation factor PCF in accordance with $$PCF = \frac{\Delta WaferCDpre}{\Delta MicroCD}$$

where TargetCD−MicroCD=ΔMicroCD and TargetCD−WaferCDpre=ΔWaferCDpre,
    determining a threshold value $Th_{TargetCD}$ for the target value TargetCD of the dimensions from the aerial image of the mask, and
    determining a corrected threshold vale corrTh in accordance with $$corrTh = Th_{TargetCD} + (Th1 - Th_{TargetCD}) \times PCF.$$

9. The method of claim 5 in which the correlation comprise a quotient TC of the attenuation determined from the aerial images of the mask and of the attenuation of the mask determined from the pattern resulting from the exposure of a wafer.

10. The method of claim 1 in which the characteristic is the dimension of a pattern characteristic of the mask, in particular a critical dimension.

11. The method of claim 10 in which the correlation is a function of the critical dimension of the microscope and of the critical dimension of a pattern of an exposed wafer.

12. A method for determining the dimensions of a pattern on a mask, the method comprising:
    determining a threshold value of intensity $Th_4$;
    determining a critical dimensions target value TargetCD for the dimensions of a calibration mask;
    recording an aerial image of the calibration mask;
    determining critical dimensions MicroCD from the aerial image of the calibration mask at the threshold $Th_4$;
    measuring a critical dimension WaferCDpre from a wafer exposed by a scanner;
    calculating a pre-correlation factor PCF in accordance with $$PCF = \frac{\Delta WaferCDpre}{\Delta MicroCD}$$

where TargetCD−MicroCD=ΔMicroCD and TargetCD−WaferCDpre=ΔWaferCDpre;
    recording an aerial image of a mask;

determining a threshold value $Th_{TargetCD}$ for the target value TargetCD of the dimensions from the aerial image;

determining a corrected threshold value corrTh in accordance with $$corrTh = Th_{TargetCD} + (Th_A - Th_{TargetCD}) \times PCF; \text{ and}$$

determining the dimensions at the threshold value corrTh from the aerial image.

13. A mask inspection microscope for emulating the imaging of a pattern of a mask of a scanner to expose wafers, in which the mask includes scattering centers configured to scatter a portion of projection light that illuminates the mask, comprising:
   a lens to image the mask on a detector;
   a light source and illumination optics to illuminate the mask, wherein an illumination field on the mask has a diameter d, wherein the diameter of the illumination field is smaller than the illumination field of a scanner;
   a processing unit that is configured to:
      control a recording of a first aerial image of the mask pattern,
      determine first values of at least one characteristic from the first aerial image, and
      determine second values of at least one characteristic of the first aerial image, using a correlation between the first values of at least one characteristic of aerial images of the mask pattern as produced by a mask inspection microscope, and the second values of at least one characteristic of aerial images of the mask pattern as produced by the scanner.

14. The mask inspection microscope of claim 13, in which the illumination field has a diameter d, in which the following applies:

$$d < d_i = 4l_p \, \tan\left(\arcsin\left(\frac{NA_W}{4n_M}\right)\right)$$

where $NA_W$ is a wafer-side numerical aperture of the scanner being emulated,
$n_M$ is a refractive index of a substrate of the mask, and
$l_p$ is a distance from the scattering centers to a pattern-bearing surface of the mask.

15. The mask inspection microscope of claim 13 in which the at least one characteristic comprises an attenuation of transmission or reflectivity of the mask caused by the scattering centers.

16. The mask inspection microscope of claim 15 in which an attenuation of aerial images of the mask as produced by the scanner is determined by the dimension of a mask pattern that was produced by the scanner on a wafer and from the aerial images of the mask as produced by a mask inspection microscope.

17. The mask inspection microscope of claim 15 in which a threshold value $Th_1$ is determined to determine an attenuation from an aerial image of the mask inspection microscope, wherein the dimensions correspond to the dimensions on the wafer.

18. The mask inspection microscope of claim 15 in which the aerial image was recorded by a mask that was not corrected and wherein a corrected threshold value corrTh is calculated from the threshold value $Th_1$,
   wherein corrTh is determined according to:
      predetermining a critical dimension target value TargetCD for the dimension of a calibration mask,
      recording an aerial image of the calibration mask,
      determining critical dimensions MicroCD from the aerial image using the threshold value $Th_1$,
      measuring a critical dimension WaferCDpre from a wafer exposed by a scanner,
      calculating a pre-correlation factor PCF in accordance with $$PCF = \frac{\Delta WaferCDpre}{\Delta MicroCD}$$

where TargetCD−MicroCD=$\Delta$MicroCD and TargetCD−WaferCDpre=$\Delta$WaferCDpre,
   determining a threshold value $Th_{TargetCD}$ for the target value TargetCD of the dimensions from the aerial image of the mask, and
   determining a corrected threshold vale corrTh in accordance with $$corrTh = Th_{TargetCD} + (Th1 - Th_{TargetCD}) \times PCF.$$

19. The mask inspection microscope of claim 15 in which the correlation comprise a quotient TC of the attenuation determined from the aerial images of the mask and of the attenuation of the mask determined from the pattern resulting from the exposure of a wafer.

20. The mask inspection microscope of claim 13 in which the characteristic is the dimension of a pattern characteristic of the mask, in particular a critical dimension.

* * * * *

UNITED STATES PATENT AND TRADEMARK OFFICE
CERTIFICATE OF CORRECTION

PATENT NO. : 9,535,244 B2
APPLICATION NO. : 14/594851
DATED : January 3, 2017
INVENTOR(S) : Holger Seitz et al.

It is certified that error appears in the above-identified patent and that said Letters Patent is hereby corrected as shown below:

In the Specification

Column 3

Lines 35-38 (Approx.), delete "$d < d_i = 4l_p \tan(\arcsin(\frac{NA_W}{4n_m}))$,"

and insert -- $d < d_i = 4l_p \tan(\arcsin(\frac{NA_W}{4n_M}))$ --

In the Claims

Column 11

Lines 47-50 (Approx.), in Claim 3, delete "$d > d_i = 4l_p \tan(\arcsin(\frac{NA_W}{4n_m}))$,"

and insert -- $d > d_i = 4l_p \tan(\arcsin(\frac{NA_W}{4n_M}))$ --

Signed and Sealed this
Sixteenth Day of May, 2017

Michelle K. Lee
*Director of the United States Patent and Trademark Office*